US011227885B2

(12) United States Patent
Hung et al.

(10) Patent No.: US 11,227,885 B2
(45) Date of Patent: Jan. 18, 2022

(54) IMAGE SENSOR PACKAGE WITH PARTICLE BLOCKING DAM

(71) Applicant: KINGPAK TECHNOLOGY INC., Hsin-Chu County (TW)

(72) Inventors: Li-Chun Hung, Hsin-Chu County (TW); Chien-Chen Lee, Hsin-Chu County (TW)

(73) Assignee: KINGPAK TECHNOLOGY INC., Hsin-Chu County (TW)

( * ) Notice: Subject to any disclaimer, the term of this patent is extended or adjusted under 35 U.S.C. 154(b) by 290 days.

(21) Appl. No.: 16/571,764

(22) Filed: Sep. 16, 2019

(65) Prior Publication Data

US 2020/0312898 A1    Oct. 1, 2020

(30) Foreign Application Priority Data

Mar. 26, 2019 (TW) .................................. 108110552

(51) Int. Cl.
*H01L 27/146* (2006.01)

(52) U.S. Cl.
CPC .. *H01L 27/14618* (2013.01); *H01L 27/14636* (2013.01)

(58) Field of Classification Search
CPC .................... H01L 27/14618; H01L 27/14636
See application file for complete search history.

(56) References Cited

U.S. PATENT DOCUMENTS

| 8,269,300 | B2 | 9/2012 | Chien et al. |
| 9,905,597 | B2 | 2/2018 | Yang et al. |
| 2006/0145325 | A1 | 7/2006 | Yang et al. |
| 2016/0241749 | A1* | 8/2016 | Alasimio ............. H04N 5/2252 |
| 2020/0312897 | A1* | 10/2020 | Hsieh ................ H01L 27/14618 |

FOREIGN PATENT DOCUMENTS

| TW | 200952133 A1 | 12/2009 |
| TW | 201813069 A | 4/2018 |
| TW | 201901866 A | 1/2019 |

* cited by examiner

*Primary Examiner* — John P. Dulka
(74) *Attorney, Agent, or Firm* — Li & Cai Intellectual Property (USA) Office (57) ABSTRACT

An image sensor package includes a substrate, a sensor chip, a light-permeable cover, and a particle blocking dam. The substrate has a chip accommodating space, and the sensor chip is disposed in the chip accommodating space and electrically connected to the substrate. The light-permeable cover is disposed on the substrate and disposed above the sensor chip. The particle blocking dam is disposed above the sensor chip and extends from the light-permeable cover toward the sensor chip so as to be in contact with or close to the sensor chip.

12 Claims, 7 Drawing Sheets

IMAGE SENSOR PACKAGE WITH PARTICLE BLOCKING DAM

CROSS-REFERENCE TO RELATED PATENT APPLICATION

This application claims the benefit of priority to Taiwan Patent Application No. 108110552, filed on Mar. 26, 2019. The entire content of the above identified application is incorporated herein by reference.

FIELD OF THE DISCLOSURE

The present disclosure relates to a sensor package, and more particularly to an image sensor package.

BACKGROUND OF THE DISCLOSURE

A conventional image sensor package structure at least includes a package substrate, an image sensor chip, and a cover. The cover and the package substrate jointly define a closed accommodating space, and the image sensor chip is arranged therein. The image sensor chip is disposed on and electrically connected to the package substrate.

During fabrication of the image sensor package structure, the image sensor chip and dust inevitably coexist in the closed accommodating space. On the other hand, the materials that are used in the image sensor package structure may be sources of dust generation. When the image sensor package structure is moved or wavered, the dust within the closed accommodating space may be disturbed and then fall onto a sensing region of the image sensor chip.

As such, an image sensed by the image sensor chip may contain noise or shadow, which deteriorates the recognition result. In particular, when the image sensor chip is applied in a vehicle, the image sensor chip may capture a distorted image due to the presence of the dust, which may cause an accident. Accordingly, it is still an important subject to redesign structure of the conventional image sensor package so as to avoid attachment of the dust to the sensing region of the image sensor chip as the product is being moved or wavered.

SUMMARY OF THE DISCLOSURE

In response to the above-referenced technical inadequacies, the present disclosure provides an image sensor package which can prevent the captured image from being affected by dust.

In one aspect, the present disclosure provides an image sensor package, which includes a substrate, a sensor chip, a light-permeable cover, and a particle blocking dam. The substrate has a chip accommodating space, and the sensor chip is disposed in the chip accommodating space and electrically connected to the substrate. A top surface of the sensor chip includes at least a sensing region and a pad region peripheral to and spaced apart from the sensing region. The light-permeable cover is disposed on the substrate and seals the chip accommodating space, in which the light-permeable cover has a light receiving region corresponding to a position of the sensing region. The particle blocking dam is disposed on the light-permeable cover and surrounds the light receiving region, wherein the particle blocking dam extends from the light-permeable cover toward the sensor chip so as to be in contact with or close to the sensor chip. The particle blocking dam is made of an elastic material, and an orthogonal projection of the particle blocking dam onto the top surface of the sensor chip is located between the sensing region and the pad region.

In one aspect, the present disclosure provides an image sensor package, which includes a substrate, a sensor chip, a light-permeable cover, and a particle blocking dam. The sensor chip is disposed on and electrically connected to the substrate. The light-permeable cover is disposed on the substrate and disposed above the sensor chip. The particle blocking dam is disposed above and around the sensor chip and extends from the light-permeable cover toward the sensor chip so as to be in contact with or close to the sensor chip.

Therefore, one of the advantages of the present disclosure is that the image sensor package provided in the present disclosure can prevent dust from attaching onto the sensing region of the sensor chip by the technical feature "a particle blocking dam disposed on the light-permeable cover and extending from the light-permeable cover toward the sensor chip so as to be in contact with or close to the sensor chip", thereby mitigating affection of dust on a captured image.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

First Embodiment

Figure 1:
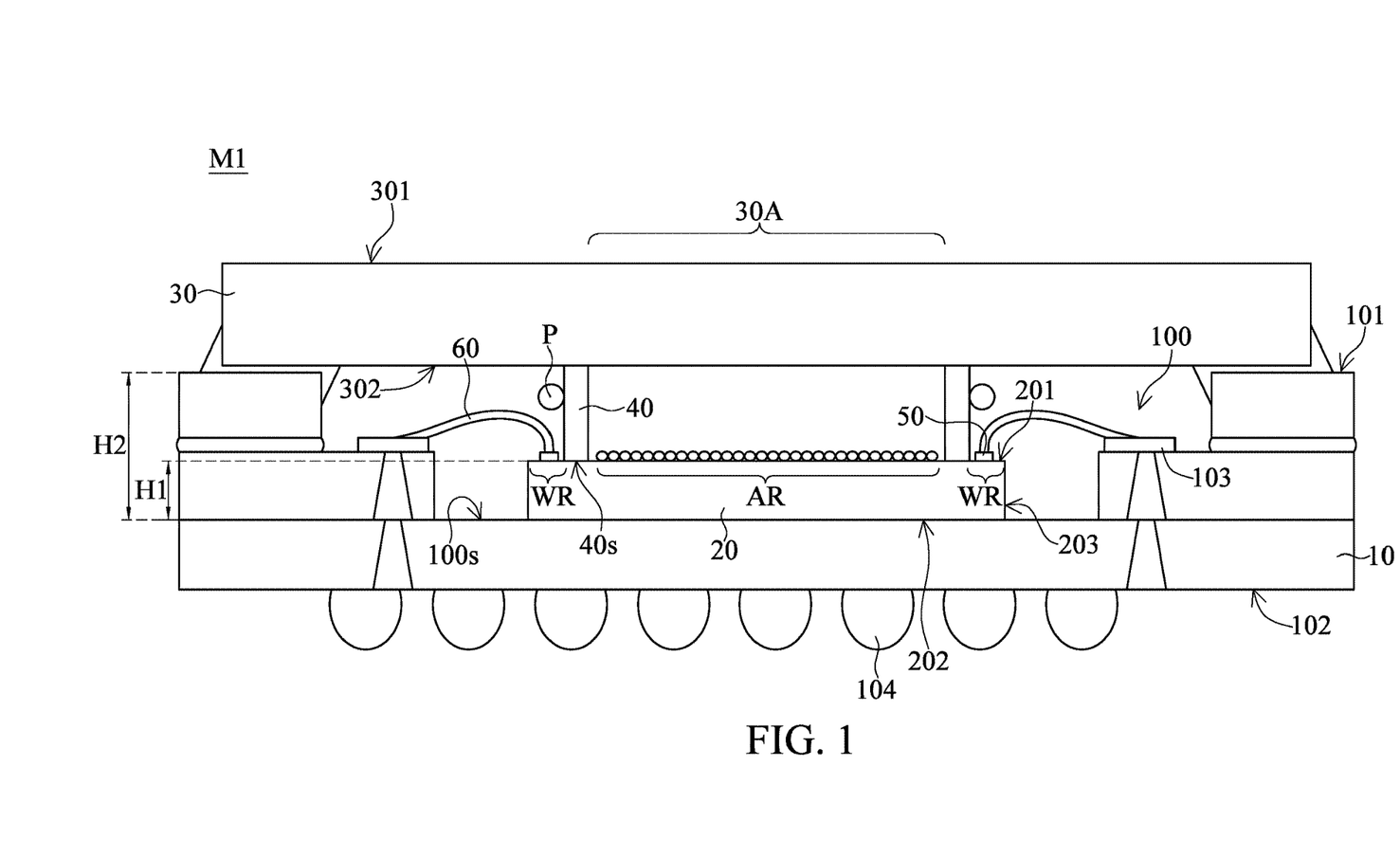
FIG. 1 is a schematic sectional view of an image sensor package according to a first embodiment of the present disclosure.
Figure 2:
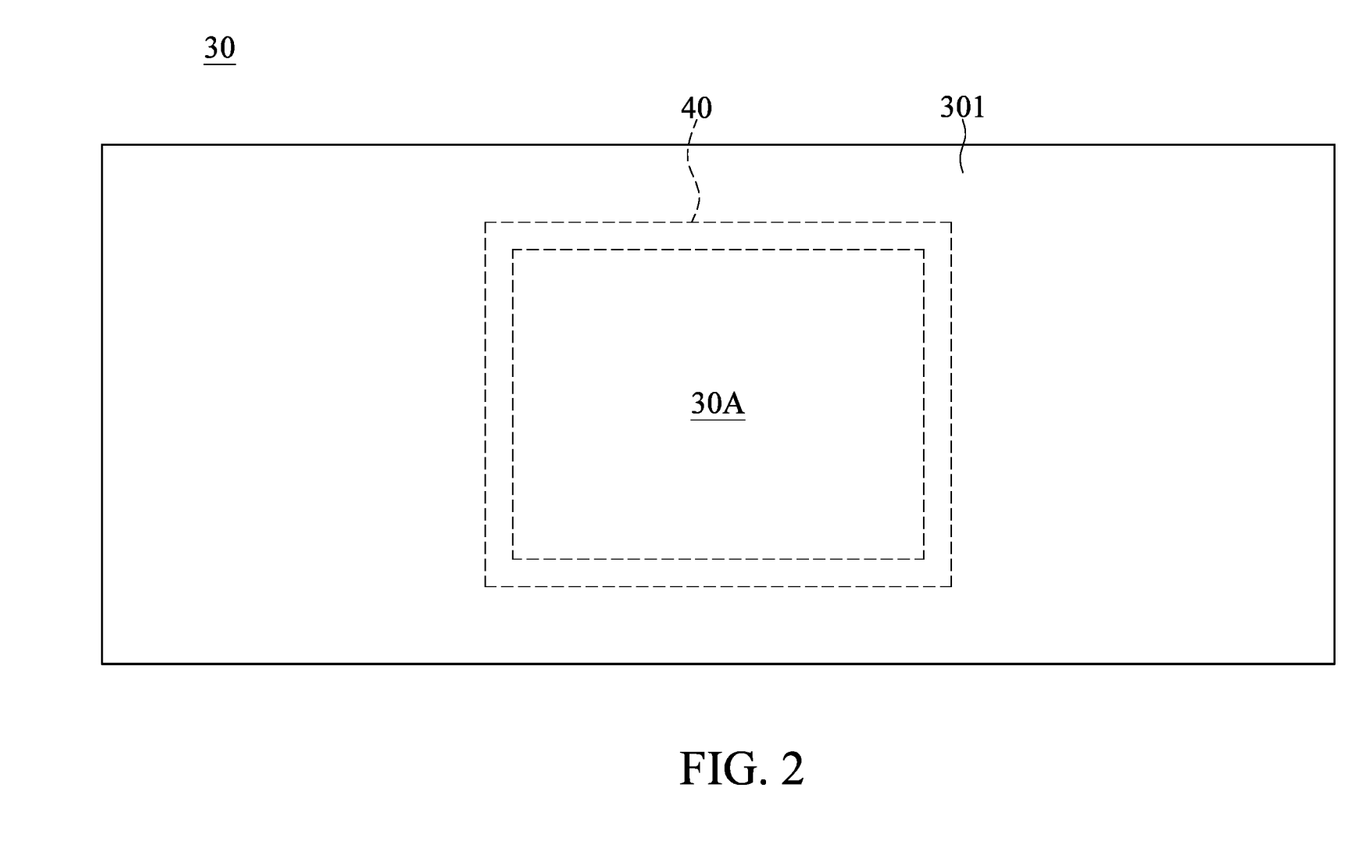
FIG. 2 is a schematic top view of the light-permeable cover according to the first embodiment of the present disclosure.

Reference is made to FIG. 1 to FIG. 2. The first embodiment of the present disclosure provides an image sensor package M1. The image sensor package M1 includes a substrate 10, a sensor chip 20, a light-permeable cover 30, and a particle blocking dam 40.

The substrate 10 can be a circuit board, a ceramic board, a metal board or a composite board. For example, the composite board can be a printed circuit board (PCB) or a flexible printed circuit board (FPC). In the instant embodiment, the substrate 10 is a ceramic board and has a chip accommodating space 100 therein. The chip accommodating space 100 is recessed from a top face 101 of the substrate 10 to form a recess.

Furthermore, the substrate 10 includes a plurality of traces and a plurality of pads 103 that have been formed thereon. Each trace can include at least one of a conductive wiring layer and a conductive via in the substrate 10. The pads 103 can be respectively electrically connected to a plurality of solder balls 104 through the traces.

It should be noted that in the instant embodiment, a sidewall surface of the chip accommodating space 100 is a stepped surface, and the pads 103 are disposed on the stepped surface of the chip accommodating space 100. The substrate 10 also includes a plurality of solder balls 104 located at a bottom side of the substrate 10, so that the image sensor package M1 can be mounted on and electrically connected to another board (not shown) through the solder balls 104.

As shown in FIG. 1, the sensor chip 20 is disposed on the substrate 10 and located in the chip accommodating space 100. Specifically, the sensor chip 20 is disposed on a bottom surface 100s of the chip accommodating space 100. Moreover, in the present embodiment, a height H1 of a top surface 201 of the sensor chip 20 relative to the bottom surface 100s of the chip accommodating space 100 is lower than a height H2 of the top face 101 of the substrate 10 relative to the bottom surface 100s of the chip accommodating space 100.

In the instant embodiment, the sensor chip 20 is an image sensor chip, but the present disclosure is not limited thereto. The sensor chip 20 has a top surface 201, a back surface 202, and a side surface 203, in which the top surface 201 and the back surface 202 are respectively located at two opposite sides, and the side surface 203 is connected between the top surface 201 and the back surface 202.

The top surface 201 of the sensor chip 20 has a sensing region AR and a pad region WR peripheral to and spaced apart from the sensing region AR. A control circuit (not shown) electrically connected to the sensing region AR and a plurality of contact pads 50 have been formed within the pad region WR, so that signals detected by the sensing region AR can be transmitted to an external circuit.

To be more specific, the image sensor package M1 further includes a plurality of bonding wires 60 so that the contact pads 50 disposed on the sensor chip 20 can be respectively electrically connected to the pads 103 disposed on the substrate 10 through the corresponding bonding wires 60.

Reference is made to FIG. 1. The light-permeable cover 30 is disposed on the substrate 10, and the light-permeable cover 30 and the substrate 10 jointly define a closed space. Specifically, the light-permeable cover 30 is disposed on the top face 101 of the substrate 10 to seal the chip accommodating space 100. The light-permeable cover 30 has an outer surface 301 and an inner surface 302 opposite to the outer surface 301. The light-permeable cover 30 is disposed on the substrate 10 with the inner surface 302 facing toward the sensor chip 20.

Furthermore, the light-permeable cover 30 has a light receiving region 30A that is disposed above and corresponds to the sensing region AR. As such, light to be detected by the sensor chip 20 may pass through the light receiving region 30A of the light-permeable cover 30. For example, if the sensor chip 20 is configured to receive visible light, the light receiving region 30A is transmissible to majority range of the visible light. In another embodiment, the light receiving region 30A only allows light at specific wavelength, to be received by the sensor chip 20, to pass therethrough and blocks light at other wavelength. For example, when light to be detected by the sensor chip 20 is infrared light, the light receiving region 30A allows only the infrared light to pass therethrough and blocks visible light.

As shown in FIG. 1 and FIG. 2, the image sensor package M1 in the embodiment of the disclosure includes the particle blocking dam 40. The particle blocking dam 40 is disposed on the light-permeable cover 30 and extends from the inner surface 302 of the light-permeable cover 30 toward the sensor chip 20 so as to be in contact with or close to the sensor chip 20. As such, the particles P in the chip accommodating space 100 can be prevented from attaching to the sensing region AR as the image sensor package M1 is moved or wavered.

Reference is made to FIG. 2. In the instant embodiment, the particle blocking dam 40 surrounds the light receiving region 30A of the light-permeable cover 30. When the light-permeable cover 30 is disposed on the substrate 10, an orthogonal projection of the particle blocking dam 40 on the top surface 201 of the sensor chip 20 is located between the sensing region AR and the pad region WR. In other words, the orthogonal projection of the particle blocking dam 40 on the top surface 201 of the sensor chip 20 is located between each of the contact pads 50 and the sensing region AR. In the instant embodiment, a bottom end surface 40s of the particle blocking dam 40 is in contact with the top surface 201 of the sensor chip 20 and located between the sensing region AR and the pad region WR so as to isolate the particles P from the sensing region AR.

In the instant embodiment, the particle blocking dam 40 is made of an elastic material or a flexible material, such as UV adhesive, epoxy, or rubber. Accordingly, the particle blocking dam 40 can serve as a buffer. When the light-permeable cover 30 is assembled on the substrate 10, the particle blocking dam 40 can be compressed and then deformed so as to avoid applying an over large pressure on the sensor chip 20, and thus preventing the sensor chip 20 from being damaged.

On the other hand, since obliquely incident light or stray light may result in noise in an image captured by the sensor chip 20, the particle blocking dam 40 can be made of a light-absorbing material or a material having a relatively low transmittance, for absorbing or blocking the obliquely incident light or stray light. The aforementioned obliquely incident light is the light incident on the sensing region AR with an inclined angle of more than 70 degrees relative to an optical axis of the sensing region AR (which is perpendicular to the outer surface 301 of the light-permeable cover 30). That is to say, the particle blocking dam 40 can block light that comes from the pace other than a position directly above the sensing region AR, thereby improving a quality of the captured image. The aforementioned material with a low transmittance can be any material which is capable of preventing obliquely incident light or stray light from transmitting through the material.

It should be noted that in the embodiment shown in FIG. 2, a top view of the particle blocking dam 40 is in closed-loop shape and surrounds the entire light receiving region 30A. However, the shape of the top view of the particle blocking dam 40 is not limited to the example provided herein.

Figure 3:
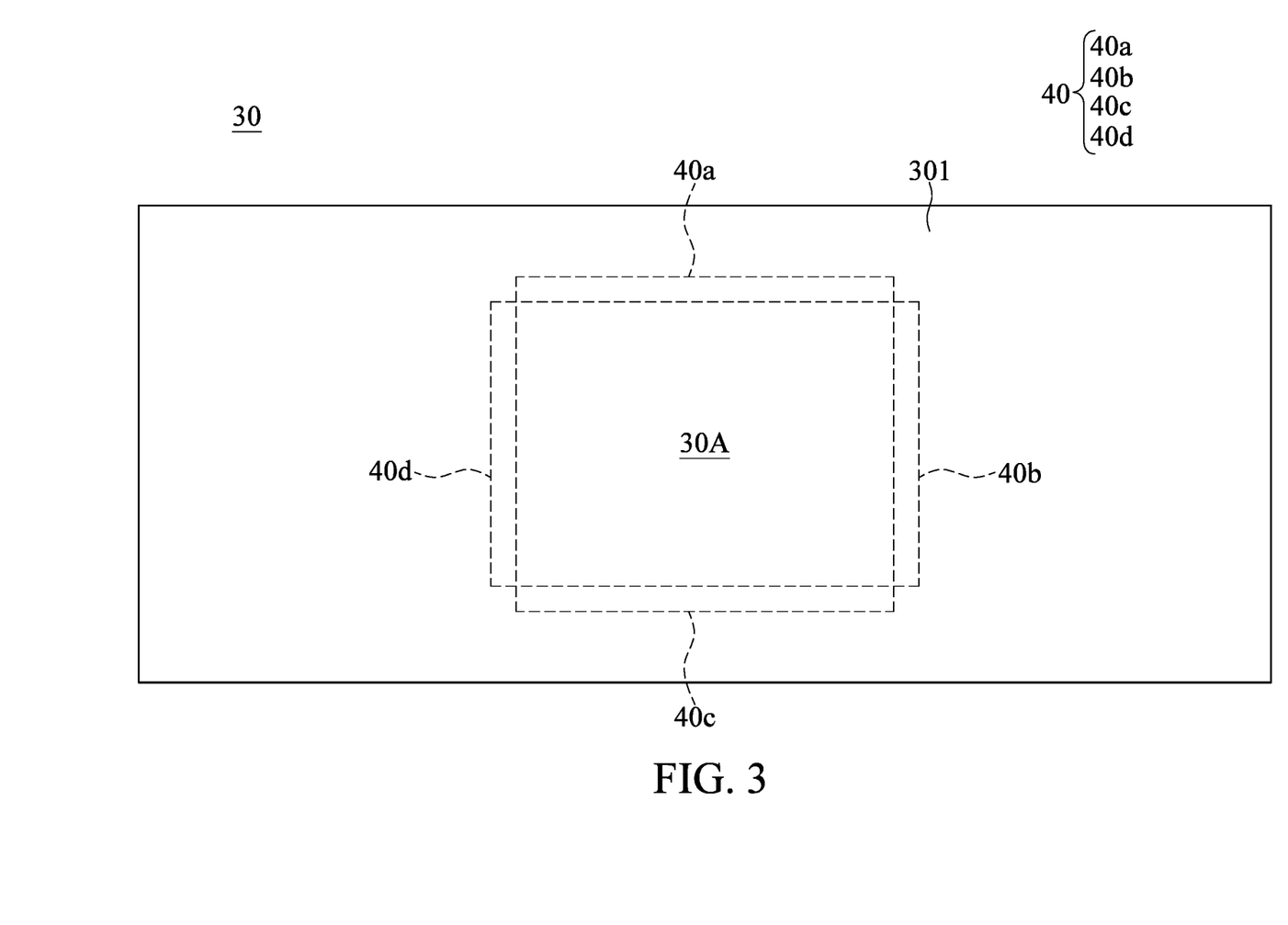
FIG. 3 is a schematic top view of a light-permeable cover according to another embodiment of the present disclosure.

Reference is made to FIG. 3, which is a schematic top view of a light-permeable cover according to another embodiment of the present disclosure.

In the instant embodiment, the particle blocking dam 40 includes a plurality of isolation portions 40a-40d, and any two adjacent isolation portions 40a-40d jointly define a gap therebetween. The isolation portions 40a-40d are surroundingly disposed at a periphery of the light receiving region 30A. As long as a gap width between any two adjacent isolation portions 40a-40d is not more than 2 μm, the particle blocking dam 40 still can prevent the particles P from entering the sensing region AR. By incorporating the particle blocking dam 40 into the image sensor package M1, the fabrication process of the image sensor package M1 can be simplified and the manufacturing cost can be reduced.

Moreover, the particle blocking dam 40 is arranged outside of a region spanned by the bonding wires 60. That is to say, when the light-permeable cover 30 is assembled on the substrate 10, the particle blocking dam 40 does not interfere with the bonding wires 60, thereby preventing the bonding wires 60 from being damaged.

Second Embodiment

Figure 4:
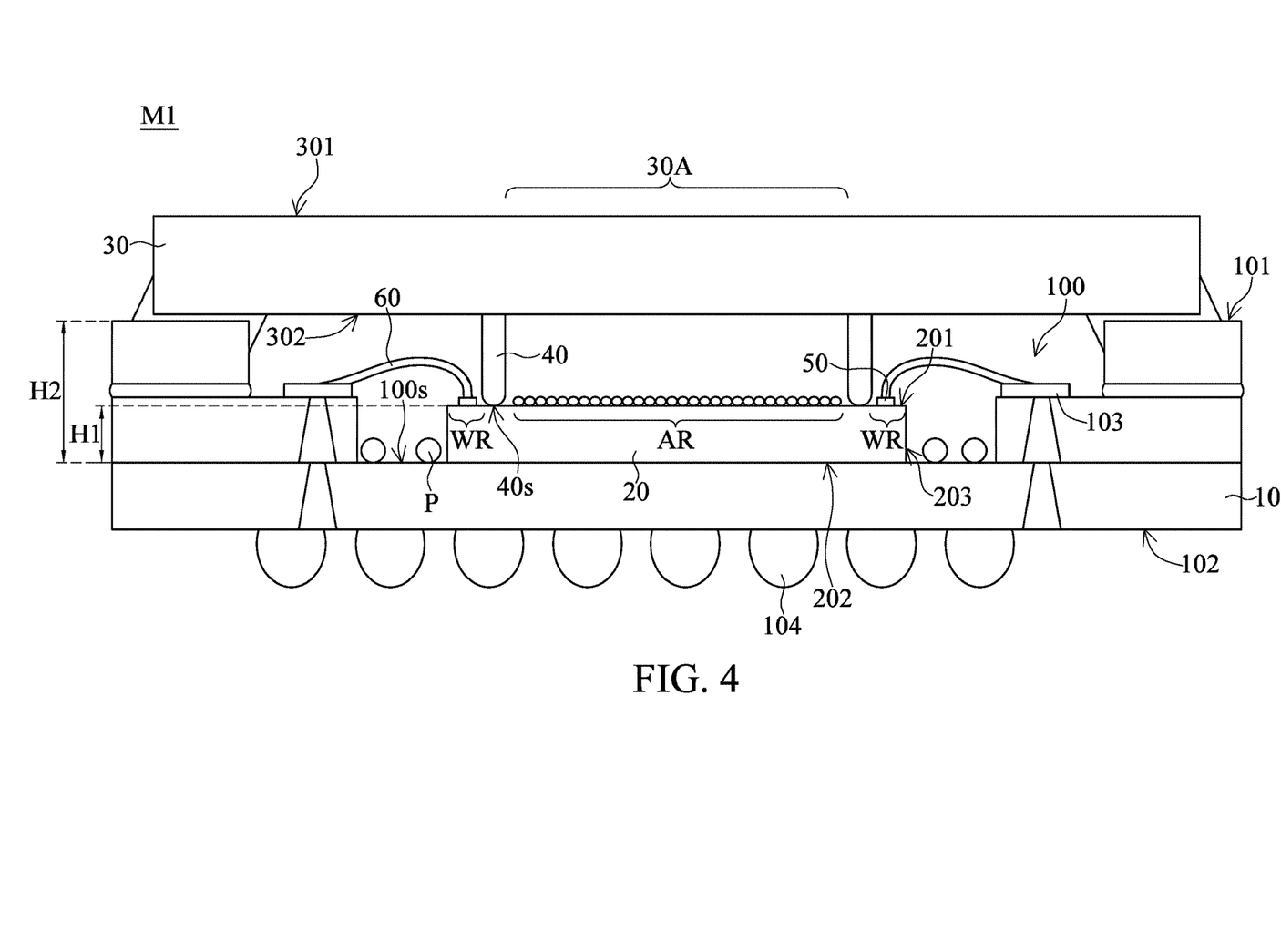
FIG. 4 is a schematic sectional view of an image sensor package according to a second embodiment of the present disclosure.

Reference is made to FIG. 4, which is a schematic sectional view of an image sensor package according to a second embodiment of the present disclosure. In the image sensor package of the instant embodiment, the bottom end surface 40s of the particle blocking dam 40 is an arc surface. When the light-permeable cover 30 is assembled onto the substrate 10, the possibility that the bonding wires 60 being touched, pressed or broken due to an assembly error is reduced. Furthermore, since the contact area between the arc surface of the particle blocking dam 40 and the sensor chip 40 becomes smaller, the sensor chip 20 can be prevented from being damaged by a large pressure applied by the particle blocking dam 40 thereon.

Third Embodiment

Figure 5:
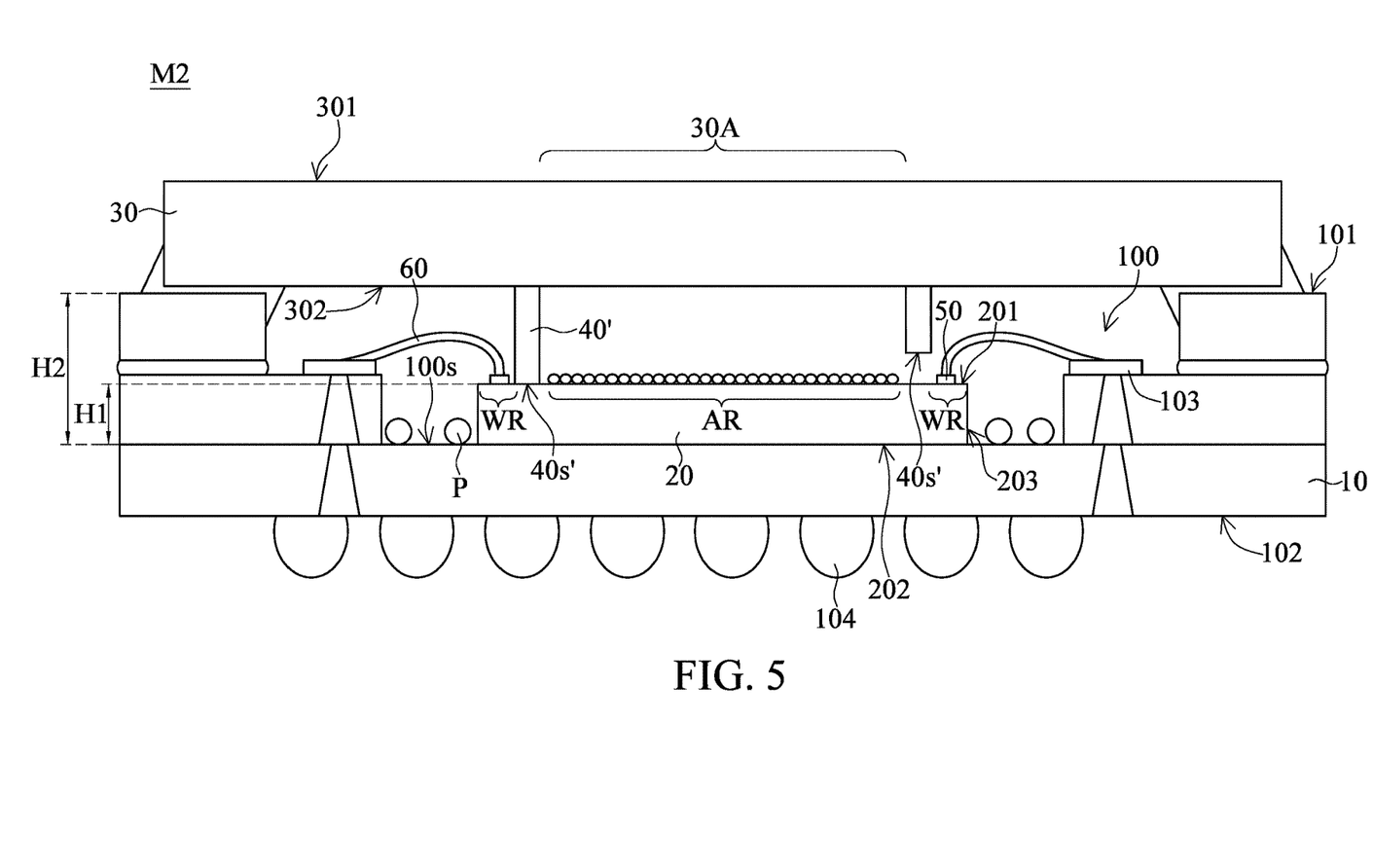
FIG. 5 is a schematic sectional view of an image sensor package according to a third embodiment of the present disclosure.

Reference is made to FIG. 5, which is a schematic sectional view of an image sensor package according to a third embodiment of the present disclosure. It should be noted that it is not necessary for the bottom end surface 40s' of the particle blocking dam 40' to be completely in contact with or separated from the top surface 201 of the sensor chip 20. As shown in FIG. 5, in the image sensor package M2 of the instant embodiment, relative to the inner surface 302 of the light-permeable cover 30, the bottom end surface 40s' of the particle blocking dam 40' has different heights respectively at different portions. Specifically, the particle blocking dam 40' can have a jagged bottom portion or a wave-like bottom portion, so that the particle blocking dam 40' is partially in contact with the top surface 201 of the sensor chip 20. As such, it can prevent the sensor chip 20 from being damaged due to a large pressure applied on the sensor chip 20 when the light-permeable cover 30 is assembled on the substrate 10. However, the aforementioned example is just one of many feasible embodiments, and the present disclosure is not limited thereto.

Fourth Embodiment

Figure 6:
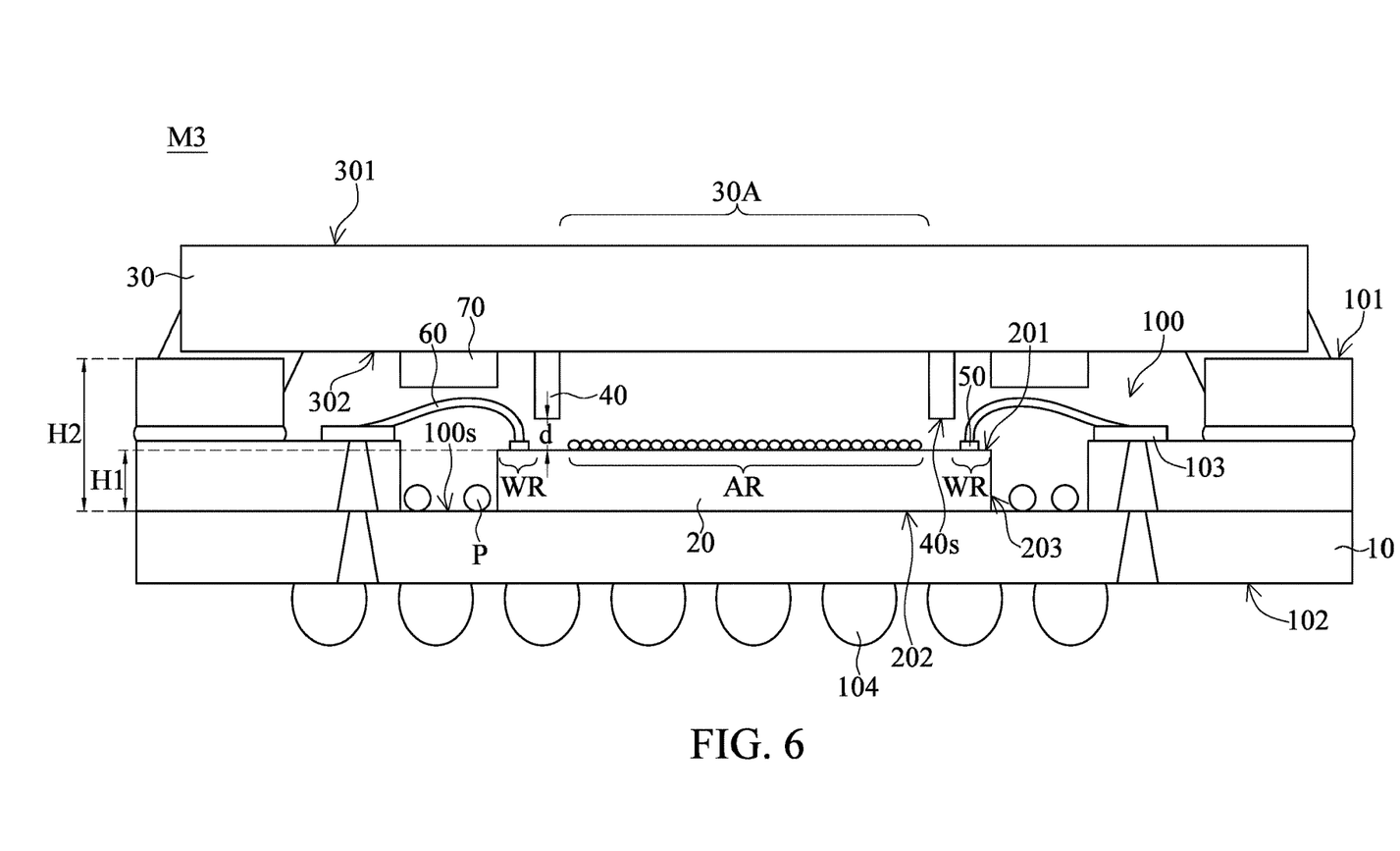
FIG. 6 is a schematic sectional view of a particle-covering layer of an image sensor package in an initial state according to a fourth embodiment of the present disclosure.
Figure 7:
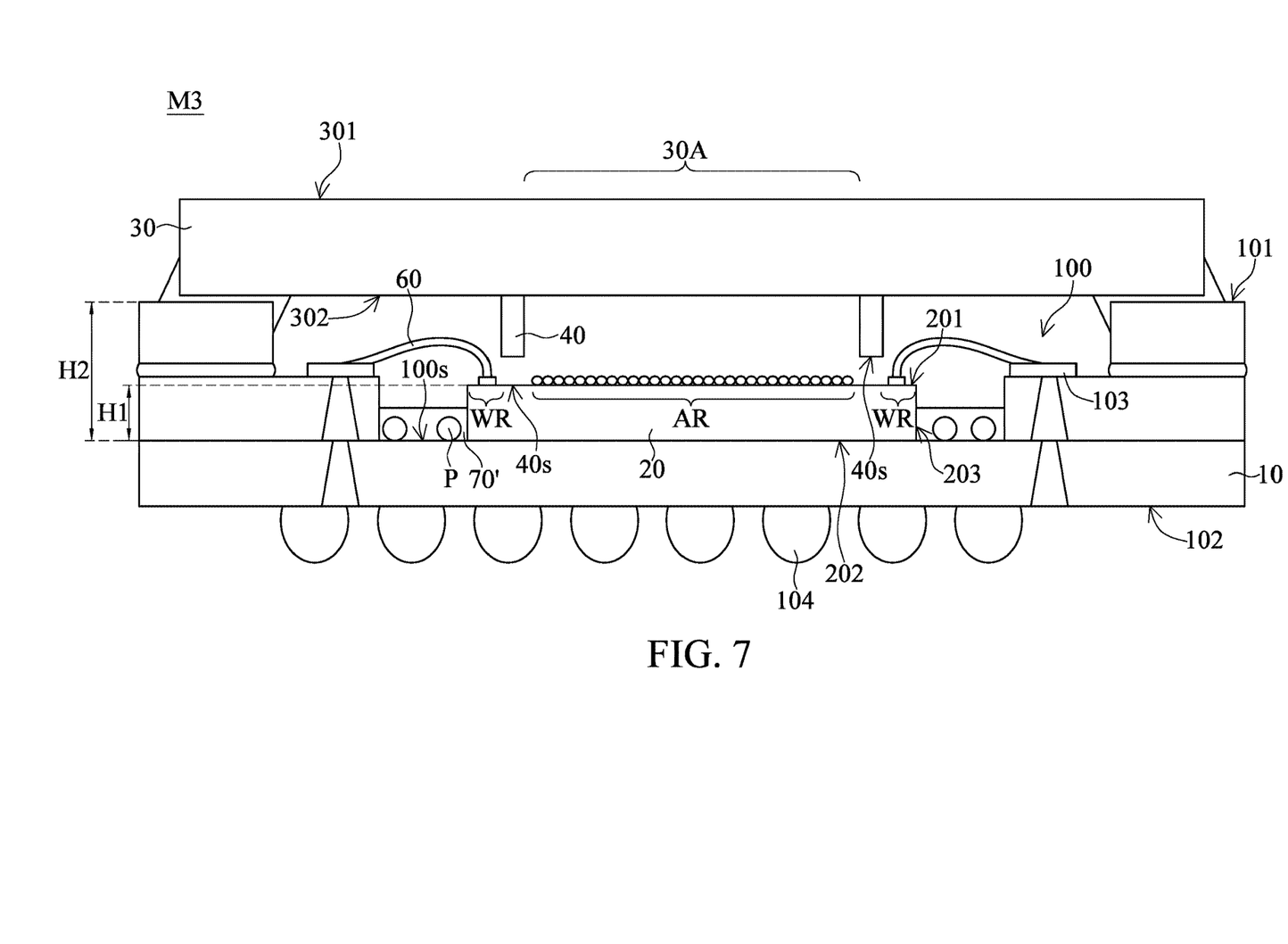
FIG. 7 is a schematic sectional view of the particle-covering layer of an image sensor package in a particle-fixing state according to the fourth embodiment of the present disclosure.

Reference is made to FIG. 6 and FIG. 7. In the image sensor package M3 of the instant embodiment, the bottom end surface 40s of the particle blocking dam 40 is spaced apart from the top surface 201 of the sensor chip 20 by a predetermined distance so as to define a gap therebetween. That is to say, the particle blocking dam 40 is not in contact with the sensor chip 20. In one embodiment, when the predetermined distance (d) between the bottom end surface 40s of the particle blocking dam 40 and the top surface 201 of the sensor chip 20 is less than 5 μm, the particles P can be prevented from entering the sensing region AR. Furthermore, since the bottom end surface 40s of the particle blocking dam 40 is not in contact with the top surface 201 of the sensor chip 20, no pressure is applied on the sensor chip 20 by the light-permeable cover 30 during assembly of the light-permeable cover 30. Furthermore, the image sensor package M3 further includes a particle-covering layer 70 (70') located around the sensor chip 20. It should be noted that the particle-covering layer 70 (70') can transit from an initial state to a particle-fixing state for fixing the particles P. Reference is made to FIG. 6, which is a schematic sectional view of a particle-covering layer of an image sensor package in the initial state according to a fourth embodiment of the present disclosure. When the particle-covering layer 70 is in the initial state, the particle-covering layer 70 is arranged at the inner surface 302 of the light-permeable cover 30 and spaced apart from the particle blocking dam 40. Furthermore, the particle-covering layer 70 is made of a material different from that of the particle blocking dam 40. For example, the material of the particle-covering layer 70 can be epoxy or semi-cured adhesive, which has a phase transition temperature. In the instant embodiment, the phase transition temperature of the particle-covering layer 70 is lower than a melting temperature of the particle blocking dam 40. During heating of the particle-covering layer 70, the particle-covering layer 70 gradually melts and becomes glue with fluidity. Thereafter, the particle-covering layer 70 gradually drips from the light-permeable cover 30 onto the substrate 10 to encapsulate or stick the particles P. Reference is made to FIG. 7. When the particle-covering layer 70' is in the particle-fixing state, the particle-covering layer 70' covers the substrate 10 and is connected to the side surface 203 of the sensor chip 20. Furthermore, a maximum thickness exists between a top surface of the particle-covering layer 70' and a top face (which includes the bottom surface 100s and the sidewall surface of the chip accommodating space 100) of the substrate 10. The maximum thickness is less than a thickness of the sensor chip 20 (i.e., the height H1 of the top surface 201 of the sensor chip 20 relative to the bottom surface 100s of the chip accommodating space 100).

That is to say, since the particle-covering layer 70 in the initial state is spaced apart from the particle blocking dam 40, during phase transition of the particle-covering layer 70, the particle-covering layer 70 does not flow to the sensing region AR through the gap defined between the particle blocking dam 40 and the sensor chip 20. Since the particles P can be fixed by the particle-covering layer 70' in the particle-fixing state, the particles P do not contaminate the sensing region AR even when the image sensor package M3 is perturbed or shaken during transportation. As such, the quality of an image captured by the sensor chip 20 can be improved. However, the abovementioned example is just one of many feasible embodiments, and does not limit the present disclosure. In another embodiment, the particle-covering layer 70 (70') can also be applied in the image sensor package M1 (M2) disclosed in the first, second, or third embodiment. In conclusion, one of the advantages of the present disclosure is that in the image sensor package M1 (M2), by the technical feature of "a particle blocking dam 40 disposed on the light-permeable cover 30 and extending from the light-permeable cover 30 toward the sensor chip 20 so as to be in contact with or close to the sensor chip 20," dust or the particles P can be prevented from attaching onto the sensing region AR of the sensor chip 20, thereby mitigating affection of dust on a captured image. To be more specific, an orthogonal projection of the particle blocking dam 40 onto the top surface 201 of the sensor chip 20 is located between the sensing region AR and the pad region WR, and the particle blocking dam 40 is made of an elastic material or flexible material. When the light-permeable cover 30 is assembled onto the substrate 10, the particle blocking dam 40 can be compressed and then deformed to prevent a large pressure from being applied on the sensor chip 20, thereby avoiding to damage the sensor chip 20.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An image sensor package comprising:
   a substrate having a chip accommodating space;
   a sensor chip disposed in the chip accommodating space and electrically connected to the substrate, wherein a top surface of the sensor chip includes a sensing region and a pad region peripheral to and spaced apart from the sensing region;
   a light-permeable cover disposed on the substrate and sealing the chip accommodating space, wherein the light-permeable cover has a light receiving region corresponding to a position of the sensing region; and
   a particle blocking dam disposed on the light-permeable cover and surrounding the light receiving region, wherein the particle blocking dam extends from the light-permeable cover toward the sensor chip, wherein a bottom end surface of the particle blocking dam is spaced apart from the top surface of the sensor chip by a predetermined distance to define a gap between the particle blocking dam and the sensor chip, and the predetermined distance is less than 5 µm;
   wherein the particle blocking dam is made of an elastic material, and an orthogonal projection of the particle blocking dam onto the top surface of the sensor chip is located between the sensing region and the pad region.

2. The image sensor package according to claim 1, wherein a bottom end surface of the particle blocking dam is an arc surface.

3. The image sensor package according to claim 1, further comprising: a particle-covering layer located around the sensor chip for transitioning from an initial state to a particle-fixing state for fixing particles.

4. The image sensor package according to claim 3, wherein when the particle-covering layer is in the particle-fixing state, the particle-covering layer covers the substrate and connects to a side surface of the sensor chip, and a maximum vertical distance between a top surface of the particle covering layer and a top face of the substrate is less than a thickness of the sensor chip.

5. The image sensor package according to claim 3, wherein when the particle-covering layer is in the initial state, the particle-covering layer is disposed on an inner surface of the light-permeable cover and spaced apart from the particle blocking dam.

6. The image sensor package according to claim 3, wherein a material of the particle-covering layer is a semi-cured adhesive, and a phase transition temperature of the adhesive is lower than a melting temperature of the particle blocking dam.

7. The image sensor package according to claim 1, wherein the sensor chip further includes a plurality of contact pads disposed in the pad region, and the orthogonal projection of the particle blocking dam onto the top surface is located between each of the contact pads and the sensing region;
   wherein the image sensor package further comprises: a plurality of bonding wires respectively connecting the contact pads to the substrate so that the sensor chip is electrically connected to the substrate, and the particle blocking dam is arranged outside of a region spanned by the bonding wires.

8. The image sensor package according to claim 1, wherein the particle blocking dam is made of a light absorbing material or a material having a low light transmittance.

9. An image sensor package comprising:
   a substrate;
   a sensor chip disposed on and electrically connected to the substrate;
   a light-permeable cover disposed on the substrate and disposed above the sensor chip;
   a particle blocking dam disposed above and around the sensor chip and extending from the light-permeable cover toward the sensor chip; and
   a particle-covering layer located around the sensor chip for transitioning from an initial state to a particle-fixing state for fixing particles.

10. The image sensor package according to claim 9, wherein a bottom end surface of the particle blocking dam has different heights relative to an inner surface of the light-permeable cover respectively at different portions, and the particle blocking dam is partially in contact with the top surface of the sensor chip.

11. The image sensor package according to claim 9, wherein a bottom end surface of the particle blocking dam is in contact with the top surface of the sensor chip.

12. An image sensor package comprising:
   a substrate;
   a sensor chip disposed on and electrically connected to the substrate, wherein a top surface of the sensor chip includes a sensing region and a pad region peripheral to and spaced apart from the sensing region, and the sensor chip includes a plurality of contact pads disposed on the top surface and located in the pad region;
   a light-permeable cover disposed on the substrate and disposed above the sensor chip;
   a particle blocking dam disposed above and around the sensor chip and extending from the light-permeable cover toward the sensor chip, wherein an orthogonal projection of the particle blocking dam onto the top surface is located between each of the contact pads and the sensing region; and
   a plurality of bonding wires respectively connecting the contact pads to the substrate so that the sensor chip is electrically connected to the substrate, and the particle blocking dam is arranged outside of a region spanned by the bonding wires.

* * * * *